United States Patent [19]
Yang

[11] Patent Number: 6,166,440
[45] Date of Patent: Dec. 26, 2000

[54] INTERCONNECTION FOR PREVENTING SIGNAL INTERFERENCE IN A SEMICONDUCTOR DEVICE

[75] Inventor: Hyang-Ja Yang, Kyunggi-do, Rep. of Korea

[73] Assignee: Samsung Electronics Co., Ltd., Rep. of Korea

[21] Appl. No.: 09/173,295

[22] Filed: Oct. 14, 1998

[30] Foreign Application Priority Data

Oct. 14, 1997 [KR] Rep. of Korea ............. 97-52476

[51] Int. Cl.$^7$ ............................................. H01L 23/552
[52] U.S. Cl. ................. 257/758; 257/756; 257/757; 257/759
[58] Field of Search .................... 257/756, 758, 257/759, 757

[56] References Cited

U.S. PATENT DOCUMENTS

5,585,664 12/1996 Ito ............................................. 257/758

OTHER PUBLICATIONS

LeCoz et al., "A Stochastic Algorithm for High Speed Capacitance Extraction in Integrated Circuits," *Solid State Electronics*, vol. 35, No. 7, pp. 1005–1012, 1992.

Basel, "Accurate and Efficient Extraction of Interconnect Circuits for Full–Chip Timing Analysis," pp. 118–123, 1995.

Huang et al., "Accurate Modeling of Capacitive, Resistive and Inductive Effects of Interconnect," pp. 115–117.

Ruehli et al., "Efficient Capacitance Calculations for Three–Dimensional Multiconductor Systems," *IEEE Transactions on Microwave Theory and Techniques*, vol. MTT–21, No. 2, pp. 76–82, Feb. 1973.

Huang, "Two–Dimensional Capacitance Calculation in Stratified and/or Arbitrary Dielectric Media," *IEEE Transactions on Microwave Theory and Techniques*, vol. 42, No. 3, pp. 501–504, Mar. 1994.

*Primary Examiner*—Fetsum Abraham
*Attorney, Agent, or Firm*—Myers Bigel Sibley & Sajovec

[57] ABSTRACT

A vertical or parallel interconnection structure in a semiconductor device wherein a shielding means is provided to prevent signal coupling between signal lines having small swing signals and noise sensitive signals. The shielding means is disposed between the signal lines and parallel with them and driven by power source of stable level, for example a ground voltage, a power supply voltage, or a DC voltage of arbitrary level.

9 Claims, 5 Drawing Sheets

INTERCONNECTION FOR PREVENTING SIGNAL INTERFERENCE IN A SEMICONDUCTOR DEVICE

FIELD OF THE INVENTION

The present invention relates to an interconnection structure in a semiconductor device, more particularly to an interconnection structure including a shielding means for preventing signal interference.

BACKGROUND OF THE INVENTION

Referring to FIG. 5A, an interconnection structure, for example, for use in a semiconductor memory device, is illustrated. Four data lines m11, m12, m13 and m14 are disposed as a first metal layer, and four signal lines m35, m36, m37 and m38 are arranged as a third metal layer. The data lines m11 to m14 of the first metal layer are to read/write data from/to memory cells, and the signal lines m35 to m38 of the third metal layer are to transfer a noise-sensitive signal, respectively. It is required that the chip size is reduced for cost when the degree of integrity increases. One interconnection structure to solve this demand is depicted in FIG. 5B. As shown in FIG. 5B, the four data lines m11 to m14 of the first metal layer are disposed so as to be overlapped with the four signal lines m35 to m38 in a vertical direction, respectively. According to the interconnection structure of FIG. 5B, the length occupied by the eight lines can be reduced by half a length occupied by the eight lines of FIG. 5A. However, signal interference between signal lines and data lines is caused in the vertical interconnection structure of FIG. 5B. In a horizontal interconnection structure (refer to FIG. 1A), the signal interference between signal lines (or data lines) is also caused. Therefore, emphasis has been placed on the bus lines which are sensitive to noise and transfer small swing signals. The signal interference between the signals will now be described with reference to following drawings FIGS. 1A, 1B, 2A and 2B.

FIG. 1A is perspective view of interconnection structure illustrating signal interference between two signal lines according to a first prior art. FIG. 1B is a cross-sectional view taken along a dot line a-a' of FIG. 1A.

Referring to FIGS. 1A and 1B, two signal lines 10 and 12 of the same layer are disposed in parallel, and are insulated from each other through insulating substance 14 therebetween. In the case small swing and noise sensitive signals are transmitted through the signal lines 10 and 12, coupling capacitors C1, C2 and C3 formed by the insulating substance 14 between the first and second signal lines 10 and 12 occur as shown in FIGS. 1A and 1B. As a result, one signal transmitted by one signal line can be interfered by the other signal transferred through the other signal line owing to the coupling capacitors C1, C2 and C3. Although not shown in FIG. 1B, it is obvious to ones skilled in the art that plural signal (data) lines are further formed between the insulating layer 14a and a substrate SUB.

FIG. 2A is perspective view of interconnection structure illustrating signal interference between two signal lines according to a second prior art. FIG. 2B is a cross-sectional view taken along a dot line b-b' of FIG. 2B.

In FIGS. 2A and 2B, two signal lines 16 and 18 are respectively disposed on different layers, i.e., one signal line 16 is disposed on a lower insulating layer 20a and the other signal line 18 is disposed on an upper insulating layer 20b, but the signal lines 16 and 18 are overlapped with each other as shown in FIGS. 2A and 2B. Like the first prior art, an interconnection structure according to the second prior art has a problem that the signal interface between the signal lines 16 and 18 vertically disposed as shown in FIG. 2A can be caused through such coupling capacitors C4, C5 and C6 as illustrated in FIGS. 2A and 2B. Although not shown in FIG. 2B, it is obvious to ones skilled in the art that predetermined layers (for example, plural signal (data) lines) are further formed between the insulating layer 20a and the substrate SUB.

As mentioned above, if noise sensitive and small swing signals, for example, digital and analog signals, are transmitted through the two signal lines 10 and 12 only insulated by means of an insulating substance 14 and disposed in parallel as the same layer as depicted in FIG. 1A or 1B, or if they are transmitted through the two signal lines 16 and 18 respectively disposed as different layers and overlapped with the other as illustrated in FIGS. 2A/B, the signals cannot be recognized in the final destination as valid signals because of the signal interference through the coupling capacitors.

SUMMARY OF THE INVENTION

The present invention is intended to solve the problems, and it is an object of the invention to provide an interconnection structure in a semiconductor device for preventing signal coupling between signals which are sensitive to noise and have small swing width.

It is a further object of the invention to provide an interconnection structure in a semiconductor device, being capable of improving reliability of the semiconductor device.

Other aspect, objects, and the several advantages of the present invention will be apparent to one skilled in the art from a reading of the following disclosure and appended claims.

To achieve this and other advantages and in accordance with the purpose of the present invention, an interconnection structure for preventing signal interference in a semiconductor device comprises a first signal line for a first signal transmission; a second signal line for a second signal transmission, the second signal line disposed on the same layer and arranged in parallel with the first signal line; and a shielding means for preventing signal interference, the shielding means disposed between the first and second signal lines. The shielding means includes a first shielding line disposed between the first and second signal lines and disposed as the same layer as the first and second signal lines, a second and a third shielding lines respectively disposed as upper layer and lower layer of the first shielding line, the second and third shielding lines being overlapped with the first shielding line. And, the second and third shielding lines are formed of different layers, and the first and second signal lines and the first shielding line are formed of the same layer, and second and third shielding line layers are formed differently from a first shielding line layer.

BRIEF DESCRIPTION OF THE DRAWINGS

The invention may be understood and its objects will become apparent to those skilled in the art by reference to the accompanying drawings as follows.

DETAILED DESCRIPTION OF THE PREFERRED EMBODIMENTS

The preferred embodiments of the present invention will now be described with reference to the accompanying drawings.

We should give an attention to the fact that an interconnection structure according to the present invention has means for shielding signal coupling between the signal lines which transmit a noise-sensitive and small swing signal, respectively. The means is arranged between the signal lines, and is composed of plural shielding lines, each of which has a constant (fixed or stabilized) voltage level. According to the interconnection structure of the present invention, there can be minimized the signal coupling between the signal lines, so that a reliability (or performance) of devices, such as microprocessor, CPU, a semiconductor device comprising a semiconductor memory device, etc., is improved.

A First Embodiment

Figure 3A:
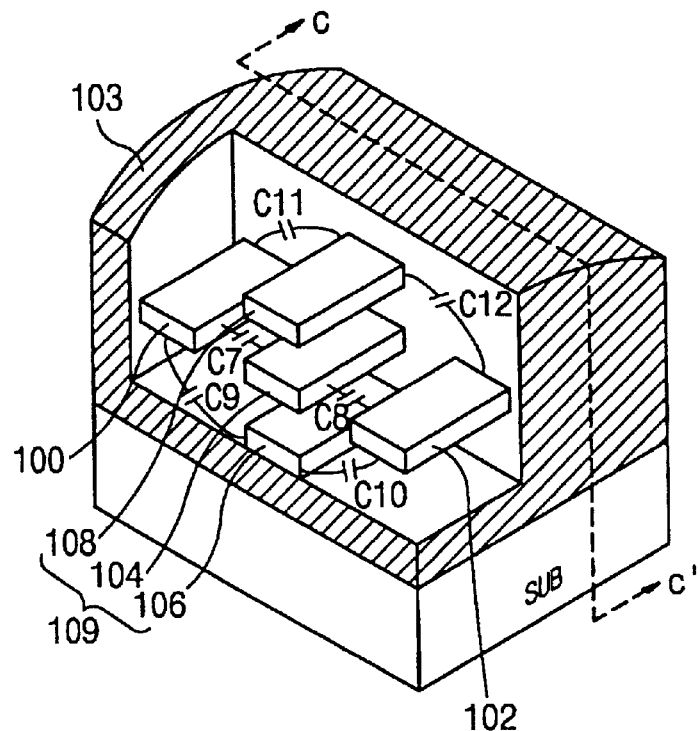
FIG. 3A is a perspective view showing an interconnection structure according to a first preferred embodiment of the present invention.
Figure 3B:
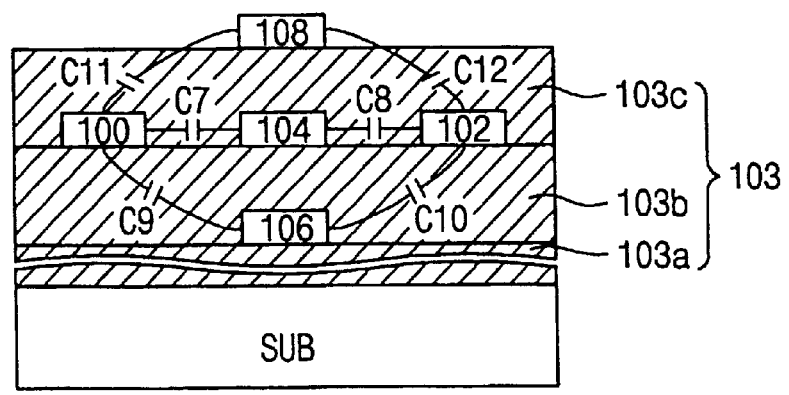
FIG. 3B is a cross-sectional view taken along a dot line c-c' of FIG. 3A.

FIG. 3A is a perspective view showing an interconnection structure according to a first preferred embodiment of the present invention, and FIG. 3B is a cross-sectional view taken along a dot line c-c' of FIG. 3A.

Referring to FIGS. 3A and 3B, two signal lines 100 and 102 of the same insulating layer 103b are formed in parallel, and transfer a noise-sensitive and small swing signal, respectively. Between the signal lines 100 and 102, there is arranged means 109 for shielding a signal interference of the signal lines 100 and 102. The signal lines 100 and 102 are used as data lines for reading/writing data from/to memory cells, or the signal lines 100 and 102 are used as lines for transmitting a sensitive signal, respectively. The means 109 is composed of first, second and third shielding lines 104, 106 and 108. The first shielding line 104 is formed both between the signal lines 100 and 102 and on the insulating layer 103b. The second shielding line 106 is placed both between the signal lines 100 and 102 and on an insulating layer 103a so as to be overlapped under the first shielding line 104. And, the third shielding line 108 is arranged both on an insulating layer 103c and between the lines 100 and 102 so as to be overlapped over the first shielding line 104. In a word, the second and third shielding lines 106 and 108 are formed of different layers, and the first and second signal lines 100 and 102 and the first shielding line 104 are formed of the same layer, and second and third shielding line layers 106 and 108 are formed differently from a first shielding line layer 104.

In this embodiment, the first, second and third shielding lines 104, 106 and 108 have a fixed (constant or stabilized) voltage, for example, a power supply voltage, a ground voltage, or an arbitrary DC voltage. Although not shown in FIG. 3B, it is obvious to ones skilled in the art that predetermined layers (for example, plural signal (data) lines) are further formed between the insulating layer 103a and the substrate SUB.

Figure 1A:
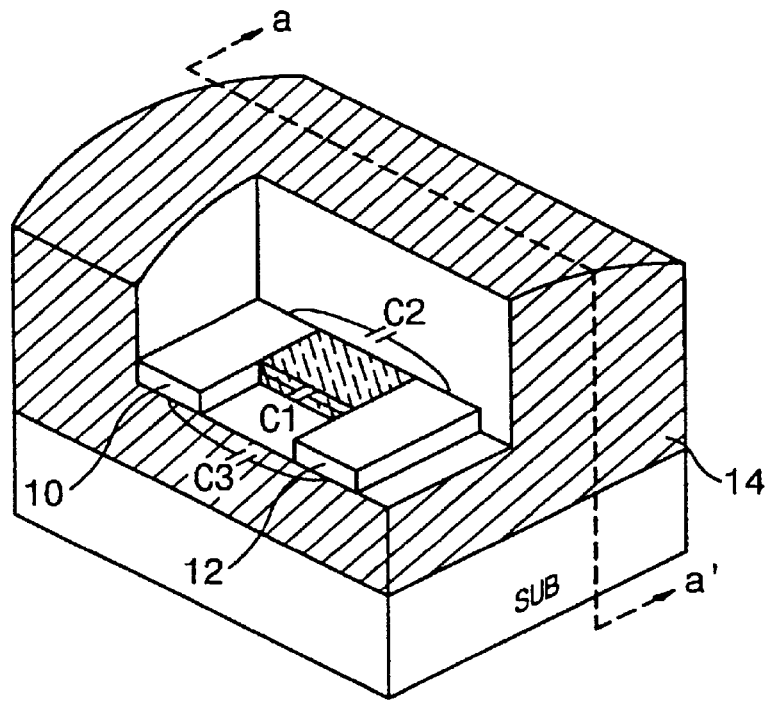
FIG. 1A is a perspective view of an interconnection structure according to a first prior art.
Figure 1B:
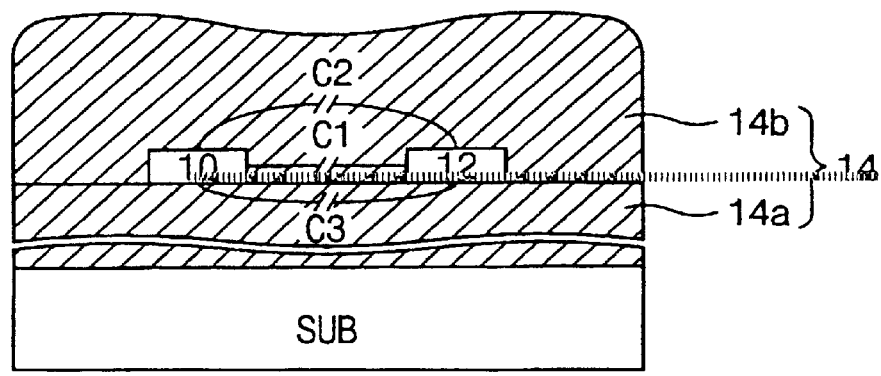
FIG. 1B is a cross-sectional view taken along a dot line a-a' of FIG. 1A.

According to the interconnection structure, the first shielding line 104 prevents the signal lines 100 and 102 from being interfered with each other through a coupling capacitor (for example, C1 of FIG. 1B) formed in the insulating layer 103b. For example, when one signal on the one signal line 100 becomes transient from a low level to a high level, the other signal on the other signal line 102 at the low level is flipped through a coupling capacitor, for example, C1, in a prior art case. In a case of the present invention, even though the one signal becomes transient, it does not almost affects the other signal because the affection owing to the one signal is offset (absorbed in) by the first shielding line 104 through coupling capacitors C7 and C8. Similarly, the signal interference between the signal lines 100 and 102 caused through coupling capacitor, for example, C2 and C3 in the insulating layer 14, is also prevented by the second and third shielding lines 106 and 108, respectively. As a result, a reliability of devices, for example, a microprocessor, CPU, a semiconductor device comprising a semiconductor memory device, etc., is improved.

A Second Embodiment

Figure 4A:
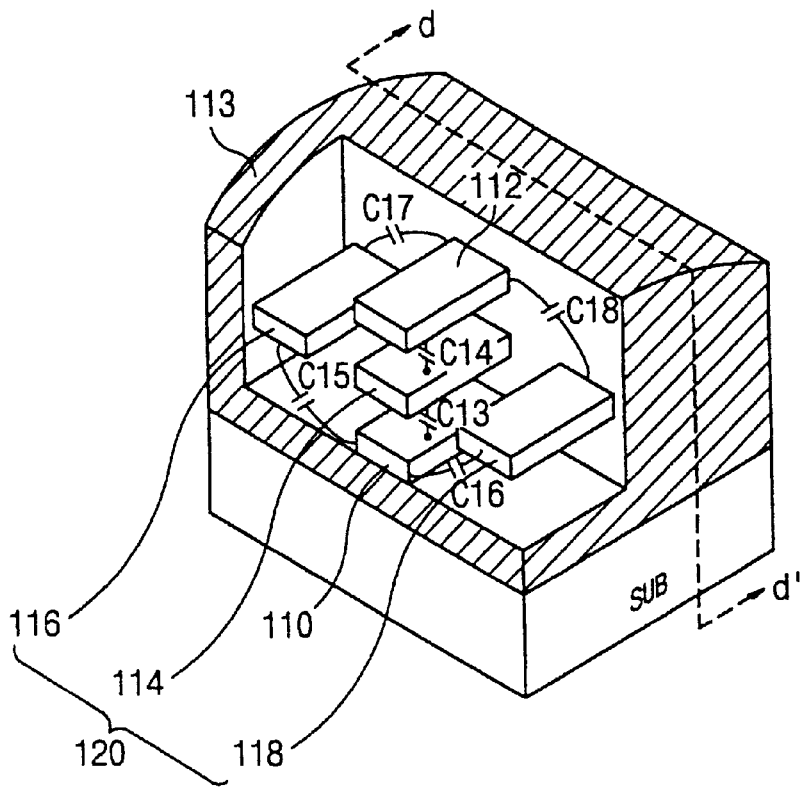
FIG. 4A is a perspective view of an interconnection structure according to a second preferred embodiment of the present invention.
Figure 4B:
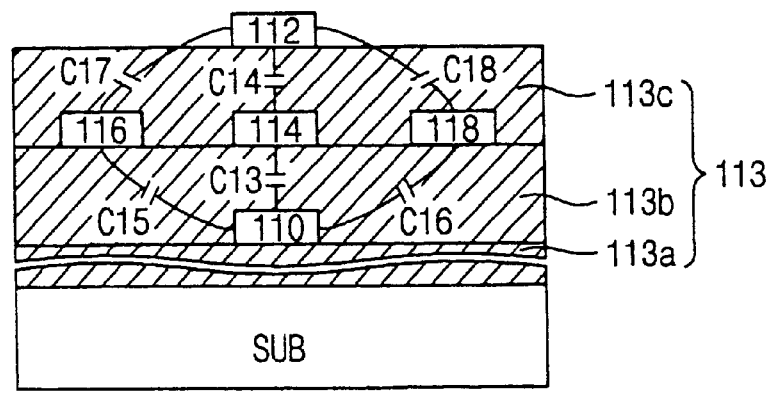
FIG. 4B is a cross-sectional view taken along a dot line d-d' of FIG. 4A.
Figure 5A:
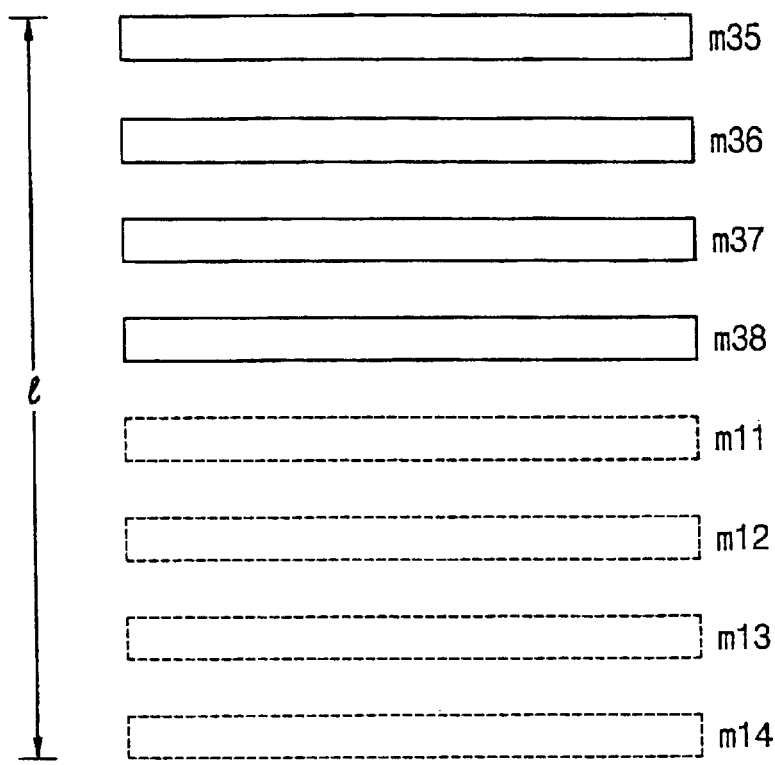
FIGS. 5A and 5B are a top view showing an interconnection structure for use in a semiconductor memory device.
Figure 5B:
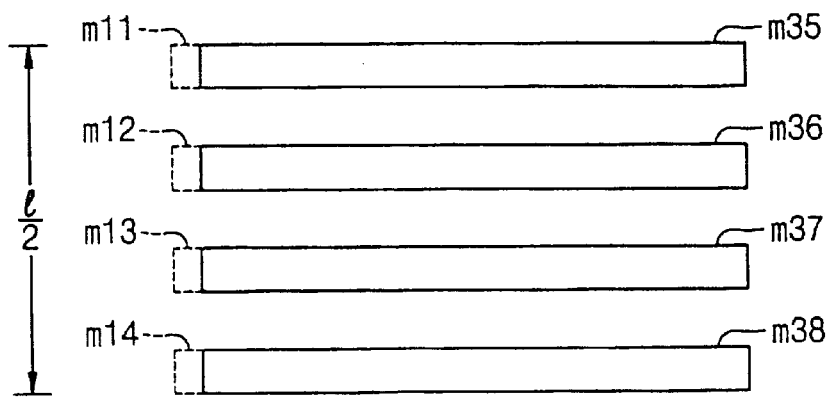

A perspective view showing an interconnection structure according to a second preferred embodiment of the present invention is illustrated in FIG. 4A, and a cross-sectional view cut along d-d' of FIG. 4A is shown in FIG. 4B.

As shown in FIGS. 4A and 4B, two signal lines 110 and 112 are formed in an insulating substance 113 composed of three insulating layers 113a, 113b and 113c. One signal line 110 is placed on the insulating layer 113a, and the other signal line is disposed on the insulating layer 113c. That is, the signal lines 110 and 112 are arranged so as to be overlapped to each other as shown in FIGS. 4A and 4B. In this embodiment, the signal lines 110 and 112 may transfer a small swing and noise-sensitive signal, respectively.

There is further provided means 120 for shielding a signal interference between the signal lines 110 and 112 through the insulating layers 113b and 113c. The means 120 is comprised of first, second and third shielding lines 114, 116 and 118. The first shielding line 114 is to shield a signal interference caused vertically between the signal lines 110 and 112, and is arranged both between the signal lines 110 and 112 and on the insulating layer 113b so as to be overlapped to both of the signal lines 110 and 112. The second shielding line 116 is to shield a signal interference occurred at a left side therebetween, and is disposed both at a left side of the first shielding line 114 and on the same insulating layer 113b as the first shielding line 114. And, the third shielding line 118 is to shield a signal interconnection caused at a right side between the lines 110 and 112, and is placed both at a right side of the first shielding line 114 and on the same insulating layer 113b as the first shielding line 114. In a word, the signal lines 110 and 112 are formed of different layers from each other and from the first, second and third shielding lines 114, 116 and 118, and the first, second and third shielding lines 114, 116 and 118 are formed as the same layer.

In this embodiment, the first, second and third shielding lines 114, 116 and 118 are driven with a fixed (constant or stabilized) voltage, for example, a power supply voltage, a ground voltage, or a DC voltage. Although not shown in FIG. 4B, it is obvious to ones skilled in the art that predetermined layers (for example, plural signal (data) lines)

are further formed between the insulating layer 113a and the substrate SUB.

Figure 2A:
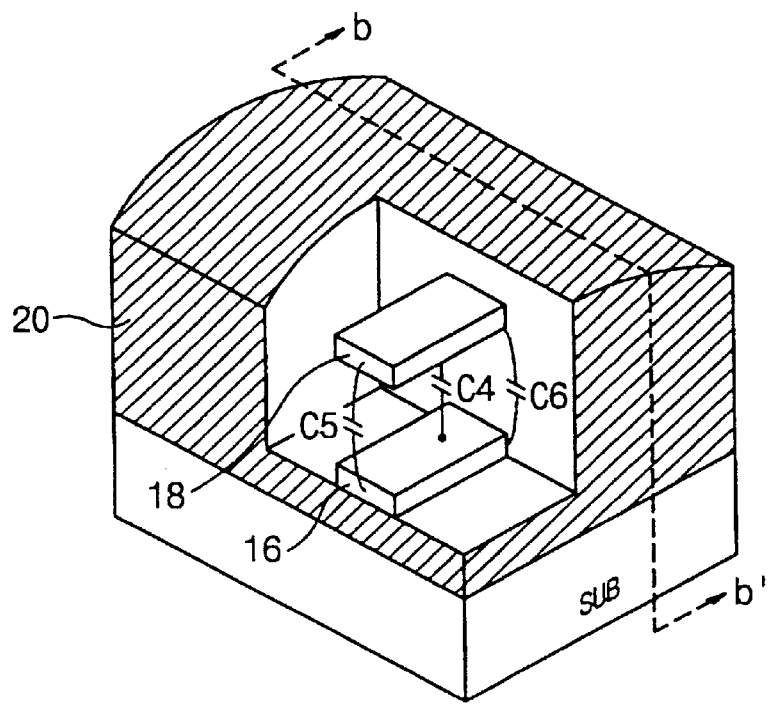
FIG. 2A is a perspective view of an interconnection structure according to a second prior art.
Figure 2B:
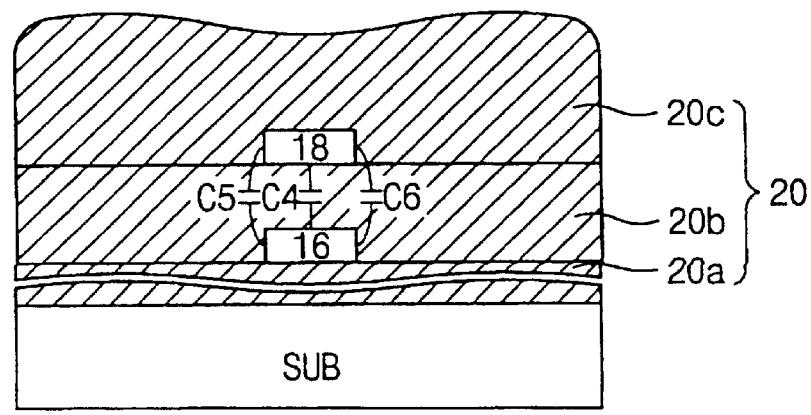
FIG. 2B is a cross-sectional view taken along a dot line b-b' of FIG. 2A.

According to the interconnection structure of the second embodiment, the first shielding line 114 prevents the signal lines 110 and 112 from being interfered with each other through vertical coupling capacitor (for example, C4 of FIG. 2B) formed in the insulating layer 113b and 113c (20b of FIG. 2B). The second and third shielding lines 116 and 118 prevent the signal lines 110 and 112 from being interfered with each other through lateral coupling capacitors (for example, C5 and C6 of Fig. 2B) formed in the insulating layer 113b and 113c (20b of FIG. 2B). For example, when one signal on the one signal line 112 becomes transient from a low level to a high level, the other signal on the other signal line 10 at the low level is affected through the coupling capacitors (for example, center, left and right coupling capacitors C4, C5 and C6 of FIG. 2B) in a prior art case. In a case of the present invention, although the one signal becomes transient, it does not almost affect the other signal because the affection owing to the one signal is offset (absorbed in) by the first, second and third shielding lines 114, 116 and 118 through coupling capacitors C13 to C18. Therefore, a performance (or reliability) of devices, for example, a microprocessor, CPU, a semiconductor device comprising a semiconductor memory device, etc., is improved.

While this invention has been particularly shown and described with reference to the preferred embodiments thereof, it will be understood by those skilled in the art that various changes in form and details may be made without departing from the spirit and scope of this invention.

What is claimed is:

1. A semiconductor device comprising:

a substrate;

a first insulating layer disposed on the substrate;

a second insulating layer disposed on the first insulating layer;

a third insulating layer disposed on the second insulating layer;

first and second signal lines disposed on the second insulating layer, the first signal line arranged in parallel with the second signal line; and overlapping first, second and third shielding lines arranged between the first and second signal lines, wherein the first, second and third shielding lines are disposed on the first, second and third insulating layers, respectively.

2. The semiconductor device according to claim 1, wherein said first, second, and third shielding lines are driven to a common voltage.

3. The semiconductor device according to claim 2, wherein the common voltage is one selected from a group consisting of a ground voltage, a power supply voltage, and a DC voltage of a level other than the ground voltage and the power supply voltage.

4. The semiconductor device according to claim 2, wherein the first and second signal lines comprise respective memory data lines.

5. A semiconductor device, comprising:

a substrate;

a first insulating layer disposed on the substrate;

a second insulating layer disposed on the first insulating layer;

a third insulating layer disposed on the second insulating layer;

overlapping first and second signal lines disposed on the first and third insulating layers, respectively; and parallel first, second and third shield lines disposed on the second insulating layer, between the first and second signal lines.

6. The semiconductor device according to claim 5, wherein the first, second and third shielding lines are driven to a common voltage.

7. The semiconductor device according to claim 6, wherein the common voltage comprises one selected from a group consisting of a ground voltage, a power supply voltage, and a DC voltage of a level other than the ground voltage and the power supply voltage.

8. The semiconductor device according to claim 5, wherein the first shielding line is disposed between the first and second signal lines, and wherein the second and third shielding lines are disposed on respective side of the first shielding line.

9. The semiconductor device according to claim 5, wherein the first and second signal lines comprise respective memory data lines.

* * * * *